United States Patent
Tsai

(10) Patent No.: US 7,538,387 B2
(45) Date of Patent: May 26, 2009

(54) STACK SIGE FOR SHORT CHANNEL IMPROVEMENT

(75) Inventor: Pang-Yen Tsai, Jhu-bei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 30 days.

(21) Appl. No.: 11/653,687

(22) Filed: Jan. 16, 2007

(65) Prior Publication Data

US 2008/0157119 A1  Jul. 3, 2008

Related U.S. Application Data

(60) Provisional application No. 60/878,006, filed on Dec. 29, 2006.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .......... 257/327; 257/336; 257/344; 257/408; 257/900

(58) Field of Classification Search ............ 257/327, 257/336, 344, 408, 900
See application file for complete search history.

(56) References Cited

U.S. PATENT DOCUMENTS

| 4,616,247 | A | * | 10/1986 | Chang et al. ............. 257/438 |
| 5,179,431 | A | * | 1/1993 | Shirai .................... 257/187 |
| 5,633,519 | A | * | 5/1997 | Yamazaki et al. ......... 257/315 |
| 6,160,299 | A | * | 12/2000 | Rodder ................... 257/408 |
| 6,346,732 | B1 | * | 2/2002 | Mizushima et al. ........ 257/382 |
| 6,489,206 | B2 | * | 12/2002 | Chen et al. ............... 438/300 |
| 6,682,965 | B1 | * | 1/2004 | Noguchi et al. ........... 438/199 |
| 6,756,264 | B2 | * | 6/2004 | Cho et al. ................ 438/241 |
| 6,927,444 | B2 | * | 8/2005 | Park et al. ................ 257/306 |
| 7,033,895 | B2 | * | 4/2006 | Lee et al. ................. 438/300 |
| 7,218,658 | B2 | * | 5/2007 | Takagi ................... 372/43.01 |
| 2005/0104134 | A1 | * | 5/2005 | Kato ....................... 257/382 |
| 2007/0018236 | A1 | * | 1/2007 | Tsuchiaki ................ 257/324 |
| 2007/0020866 | A1 | * | 1/2007 | Cheng ..................... 438/301 |
| 2007/0034906 | A1 | * | 2/2007 | Wang et al. .............. 257/224 |
| 2007/0093033 | A1 | * | 4/2007 | Wang et al. .............. 438/303 |
| 2007/0126036 | A1 | * | 6/2007 | Ohta et al. ................ 257/288 |
| 2007/0173022 | A1 | * | 7/2007 | Wang et al. .............. 438/272 |
| 2007/0235802 | A1 | * | 10/2007 | Chong et al. ............. 257/346 |
| 2007/0235817 | A1 | * | 10/2007 | Wang et al. .............. 257/392 |
| 2007/0253239 | A1 | * | 11/2007 | Wang et al. .............. 365/154 |
| 2007/0298557 | A1 | * | 12/2007 | Nieh et al. ............... 438/197 |
| 2007/0298565 | A1 | * | 12/2007 | Nieh et al. ............... 438/222 |

(Continued)

*Primary Examiner*—Ida M Soward
(74) *Attorney, Agent, or Firm*—Slater & Matsil, L.L.P.

(57) ABSTRACT

A semiconductor structure includes a first compound layer including an element, and a first impurity having a first impurity concentration; and a second compound layer including the element and a second impurity of a same conductivity type as the first impurity, wherein the second impurity has a second impurity concentration, and wherein the second compound layer is on the first compound layer. The semiconductor structure further includes a third compound layer including the element and a third impurity of a same conductivity type as the first impurity, wherein the third impurity has a third impurity concentration, and wherein the third compound layer is on the second compound layer, and wherein the second impurity concentration is substantially lower than the first and the third impurity concentrations.

10 Claims, 9 Drawing Sheets

U.S. PATENT DOCUMENTS

2008/0006818 A1* 1/2008 Luo et al. .................... 257/19
2008/0054347 A1* 3/2008 Wang ......................... 257/327
2008/0067557 A1* 3/2008 Yu et al. ..................... 257/255
2008/0087892 A1* 4/2008 Wang et al. .................. 257/51

* cited by examiner

US 7,538,387 B2

STACK SIGE FOR SHORT CHANNEL IMPROVEMENT

This application claims priority to provisional patent application Ser. No. 60/878,006, filed Dec. 29, 2006, and entitled "Stacked SiGe for Short Channel Improvement," which application is incorporated herein by reference.

TECHNICAL FIELD

This invention relates generally to integrated circuits, and more particularly to structure and formation methods of MOS devices with stressors.

BACKGROUND

Reductions in the size and inherent features of semiconductor devices (e.g., metal-oxide semiconductor (MOS) devices) have enabled continued improvement in speed, performance, density, and cost per unit function of integrated circuits over the past few decades. In accordance with a design of the transistor and one of the inherent characteristics thereof, modulating the length of a channel region underlying a gate between a source and a drain of a MOS device alters a resistance associated with the channel region, thereby affecting the performance of the transistor. More specifically, shortening the length of the channel region reduces a source-to-drain resistance of the transistor, which, assuming other parameters are maintained relatively constant, may allow an increase in current flow between the source and drain when a sufficient voltage is applied to the gate of the transistor.

To further enhance the performance of MOS devices, stress may be introduced in the channel region of a MOS device to improve its carrier mobility. Generally, it is desirable to induce a tensile stress in the channel region of an n-type MOS (NMOS) device in a source-to-drain direction and to induce a compressive stress in the channel region of a p-type MOS (PMOS) device in a source-to-drain direction.

A commonly used method for applying compressive stresses to the channel regions of PMOS devices is to grow SiGe stressors in source and drain regions. Such a method typically includes the steps of forming a gate stack on a semiconductor substrate; forming spacers on sidewalls of the gate stack; forming recesses in the silicon substrate along the gate spacers; epitaxially growing SiGe stressors in the recesses; and then annealing. Since SiGe has a greater lattice constant than silicon has, it applies a compressive stress to the channel region, which is located between a source SiGe stressor and a drain SiGe stressor. Similarly, for NMOS devices, stressors that may introduce tensile stresses, such as SiC stressors, may be formed.

The conventional stressor formation processes suffer drawbacks, however. For example, boron is a commonly used p-type impurity for source/drain regions and lightly doped source/drain regions. To reduce sheet resistance, it is preferred that the boron concentration in SiGe stressors is high. However, the addition of boron has the effect of reducing the lattice constant, and thus with a higher boron concentration, the strain introduced by SiGe stressors is relaxed more. In addition, a high boron concentration results in more boron laterally diffused into channel regions, and the short channel characteristics are adversely affected.

FIG. 1 illustrates a conventional scheme for solving the above-discussed problems. A PMOS device includes SiGe stressors 4 formed in substrate 2, wherein each of the SiGe stressors 4 includes a first layer $4_1$ and a second layer $4_2$. second SiGe layers $4_2$ are doped with p-type impurities, while first SiGe layers $4_1$ are not doped. Therefore, first SiGe layers $4_1$ act as sinks (also referred to as a diffusion barrier layer) for absorbing the p-type impurities that are diffused from second SiGe layers $4_2$. The short channel characteristics may thus be improved.

Technical difficulty exists for forming the PMOS device as illustrated in FIG. 1. The formation of first SiGe layers $4_1$ tends to be non-conformal, and thus it is difficult for SiGe to be formed on sidewalls of recesses, in which SiGe stressors 4 are formed. The thickness T of sidewall portions of SiGe layers $4_1$ tends to be low. Without adequate thickness on sidewalls, SiGe layers $4_1$ are less effective as a barrier for preventing a p-type impurity from diffusing into the channel region, and thus the effects are limited. Therefore, improved structures and methods are needed.

SUMMARY OF THE INVENTION

In accordance with one aspect of the present invention, a semiconductor structure includes a first compound layer comprising an element, and a first impurity having a first impurity concentration; and a second compound layer comprising the element and a second impurity of a same conductivity type as the first impurity, wherein the second impurity has a second impurity concentration, and wherein the second compound layer is on the first compound layer. The semiconductor structure further includes a third compound layer comprising the element and a third impurity of a same conductivity type as the first impurity, wherein the third impurity has a third impurity concentration, and wherein the third compound layer is on the second compound layer, and wherein the second impurity concentration is substantially lower than the first and the third impurity concentrations.

In accordance with another aspect of the present invention, a metal-oxide-semiconductor (MOS) device includes a semiconductor substrate; a gate stack on the semiconductor substrate; and a stressor having at least a portion in the semiconductor substrate and adjacent the gate stack. The stressor includes a first stressor region having a first impurity concentration; a second stressor region having a second impurity concentration on the first stressor region; and a third stressor region having a third impurity concentration on the second stressor region, wherein the second impurity concentration is substantially lower than the first and the third impurity concentrations.

In accordance with yet another aspect of the present invention, a metal-oxide-semiconductor (MOS) device includes a semiconductor substrate; a gate stack on the semiconductor substrate; a lightly-doped source/drain (LDD) region; and a SiGe stressor having at least a portion in the semiconductor substrate and adjacent the gate stack. The SiGe stressor includes a first SiGe region doped with a p-type impurity having a first impurity concentration; a second SiGe region doped with a p-type impurity having a second impurity concentration; and a third SiGe region doped with a p-type impurity having a third impurity concentration, wherein the second impurity concentration is substantially lower than the first and the third impurity concentrations.

In accordance with yet another aspect of the present invention, a method of forming a semiconductor structure includes forming a first silicon-containing compound layer comprising an element and a first impurity, wherein the first impurity is in-situ doped to a first impurity concentration during the step of forming the first silicon-containing compound layer; forming a second silicon-containing compound layer comprising the element on the first silicon-containing compound layer, wherein the second silicon-containing compound layer has a second impurity concentration of impurities with a same conductivity type as the first impurity; and forming a third silicon-containing compound layer comprising the element on the second silicon-containing compound layer, wherein a third impurity having a same conductivity type as the first impurity is in-situ doped to a third impurity concentration during the step of forming the third silicon-containing compound layer, and wherein the second impurity concentration is substantially lower than the first and the third impurity concentrations.

In accordance with yet another aspect of the present invention, a method of forming a semiconductor structure includes providing a semiconductor substrate; forming a gate stack on the semiconductor substrate; forming a recess in the semiconductor substrate and adjacent the gate stack; forming a stressor having at least a portion in the semiconductor substrate and adjacent the gate stack, wherein the stressor comprises a material selected from the group consisting essentially of SiGe and SiC. The step of forming the stressor includes forming a first stressor region and simultaneously doping a first impurity to a first impurity concentration; forming a second stressor region, wherein the second stressor region has a second impurity concentration; and forming a third stressor region and simultaneously doping a third impurity to a third impurity concentration, wherein the first, the second and the third impurities are of a same conductivity type, and wherein the second impurity concentration is substantially lower than the first and the third impurity concentrations. The method further includes reacting the third stressor region with a metal to form a silicide region.

The advantageous feature of the present invention includes improved short channel characteristics without sacrificing channel stresses.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for reducing lateral impurity diffusion is provided. The intermediate stages of manufacturing a preferred embodiment of the present invention are illustrated in FIGS. 2 through 6. Variations of the preferred embodiments are then discussed. Throughout the various views and illustrative embodiments of the present invention, like reference numbers are used to designate like elements.

Figure 1:
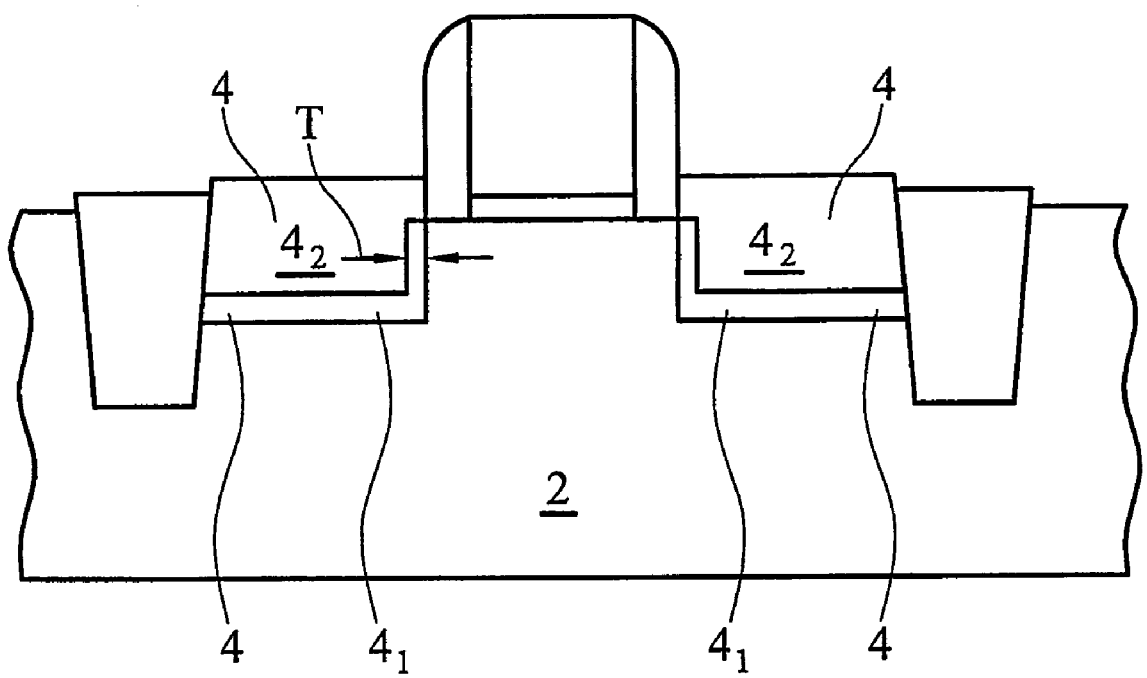
FIG. 1 illustrates a conventional PMOS device having a vertical sink layer (or a conformal diffusion barrier layer) between a SiGe stressor and a channel region of the PMOS device.
Figure 2:
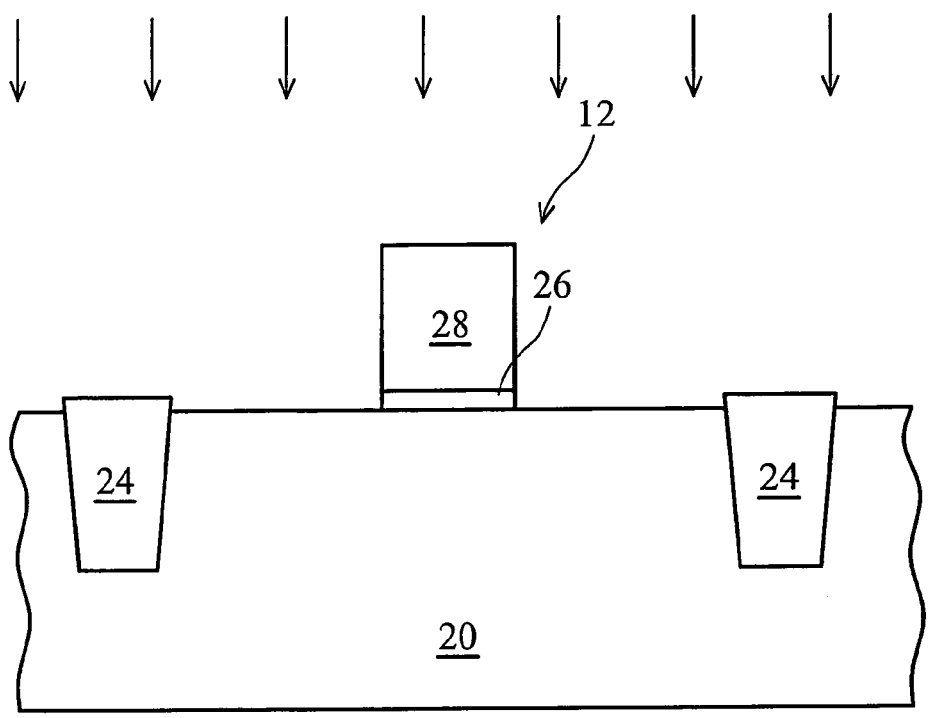
FIGS. 2 through 6 are cross-sectional views of intermediate stages in the manufacture of an embodiment of the present invention, wherein SiGe stressors comprise three regions having different compositions.

FIG. 2 illustrates a substrate 20. Preferably, substrate 20 comprises bulk silicon. Alternatively, substrate 20 comprises compounds of group III, group IV and/or group IV elements. Substrate 20 may also have a composite structure such as silicon-on-insulator (SOI) structure. Shallow trench isolation (STI) regions 24 are formed in substrate 20 to isolate device regions. As is known in the art, STI regions 24 may be formed by etching substrate 20 to form recesses, and then filling the recesses with dielectric materials such as high-density plasma oxide.

A gate stack 12 comprising a gate dielectric 26 and a gate electrode 28 is formed on substrate 20. Gate dielectric 26 may include commonly used dielectric materials such as oxides, nitrides, oxynitrides, and combinations thereof. Gate electrode 28 may include doped polysilicon, metals, metal silicides, metal nitrides, and combinations thereof. As is known in the art, gate dielectric 26 and gate electrode 28 are preferably formed by depositing a gate electrode layer on a gate dielectric layer, and then patterning the gate electrode layer and the gate dielectric layer.

An optional pre-amorphized implantation (PAI), as is symbolized by arrows, may be performed to reduce the dopant channeling effect and enhance dopant activation. In the preferred embodiment, silicon, germanium and/or carbon are implanted. In other embodiments, inert gases, such as neon, argon, krypton, xenon, and radon, are used. The pre-amorphized implantation prevents subsequently doped impurities from channeling through spaces between the crystal lattice structure and reaching depths greater than desired. At least a top portion of the (polysilicon) gate electrode 28 and exposed portions of substrate 20 are changed to an amorphous state as a result of the PAI.

Figure 3:
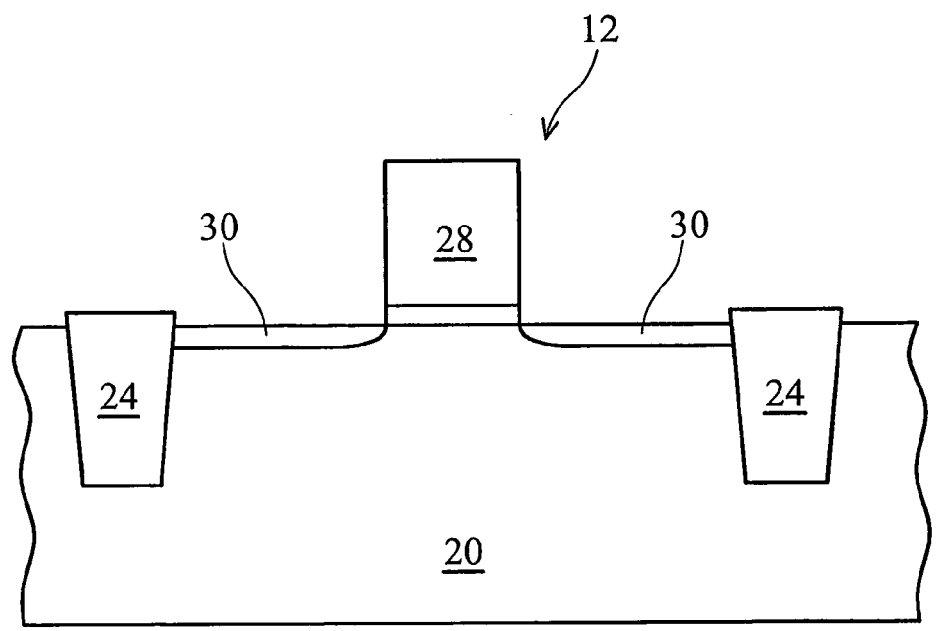

Lightly doped source/drain (LDD) regions 30 are then formed, preferably by implanting a p-type impurity, as is shown in FIG. 3. Gate stack 12 acts as a mask so that LDD regions 30 are substantially aligned with the edges of gate stack 12. Halo and/or pocket regions (not shown) may also be formed, preferably by implanting n-type impurities.

Figure 4:
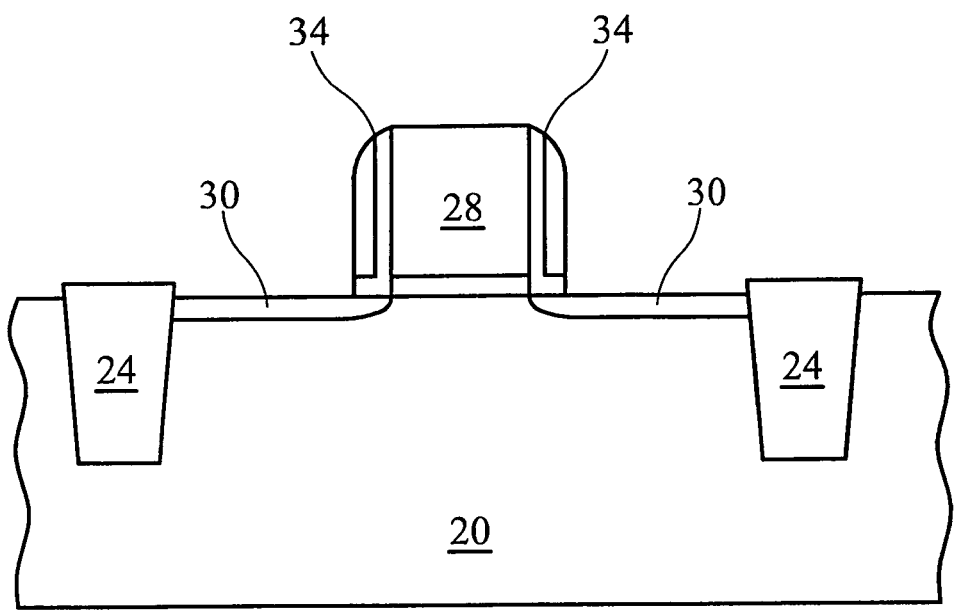

FIG. 4 illustrates the formation of gate spacers 34. As is known in the art, to form gate spacers 34, a gate spacer layer (not shown) is formed first. In an embodiment, the gate spacer layer includes a liner oxide layer and an overlying nitride layer. In alternative embodiments, the gate spacer layer may include a single layer or more than two layers, each comprising oxide, silicon nitride, silicon oxynitride (SiON) and/or other dielectric materials. The gate spacer layer may be formed using commonly used techniques, such as plasma enhanced chemical vapor deposition (PECVD), low-pressure chemical vapor deposition (LPCVD), sub-atmospheric chemical vapor deposition (SACVD), and the like.

The gate spacer layer is then patterned to form gate spacers 34, wherein the patterning may be performed by either wet etching or dry etching. Horizontal portions of the gate spacer layer are removed, and the remaining portions form gate spacers 34. The resulting gate spacers 34 are preferably thin spacers with a thickness of between about 150 Å and about 200 Å.

Figure 5:
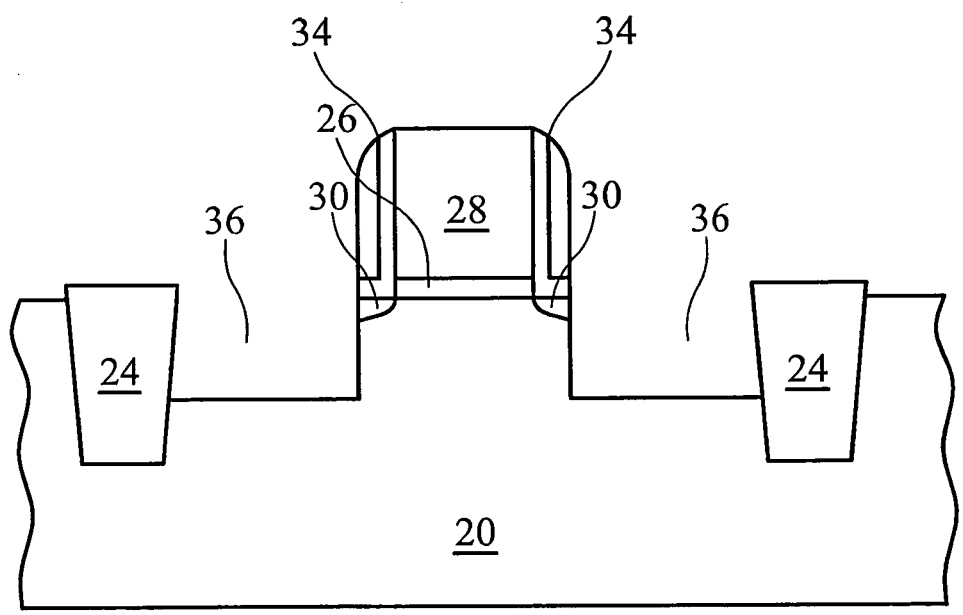

Referring to FIG. 5, recesses 36 are formed along the edges of gate spacers 34, preferably by etching isotropically or anisotropically. In 90 nm technology, the preferred depth of recesses 36 is between about 500 Å and about 1000 Å, and more preferably between about 700 Å and 900 Å. One skilled in the art will realize that the dimensions provided throughout the description are merely examples, and the preferred dimensions will change with the scaling of the technology used for forming the integrated circuits.

Figure 6:
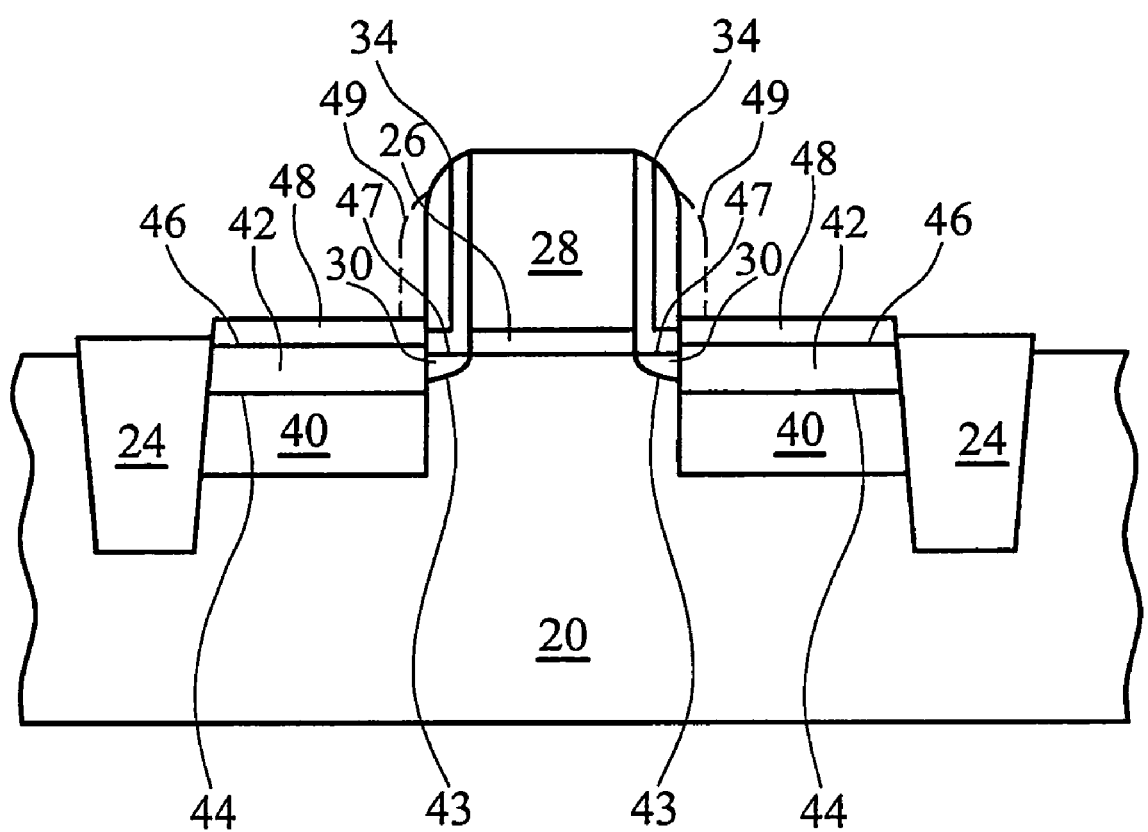

FIG. 6 illustrates the formation of epitaxy regions, often referred to as SiGe stressors. Preferably, SiGe stressors have a sandwich structure with three stacked layers 40, 42 and 48. SiGe regions 40 are first epitaxially grown in recesses 36, preferably by selective epitaxial growth (SEG). SiGe regions 40 preferably have a lattice spacing greater than the lattice spacing of substrate 20. In an exemplary embodiment, SiGe regions 40 are formed in a chamber using chemical vapor deposition (CVD). The precursors include Si-containing gases and Ge-containing gases, such as $SiH_4$, dichlorosiliane (DCS), and $GeH_4$, respectively, and the partial pressures of the Si-containing gases and Ge-containing gases are adjusted to modify the atomic ratio of germanium to silicon. Preferably, SiGe regions 40 have top surfaces 44 lower than bottom surfaces 43 of LDD regions 30. P-type impurities, such as boron, may be doped as the epitaxial growth of SiGe regions 40 proceeds (referred to as in-situ doping hereinafter). The atomic percentage of p-type impurities may be between about 0.1 atomic percent and about 0.2 atomic percent, which is equivalent to an impurity concentration of between about $5 \times 10^{19}/cm^3$ about $1 \times 10^{20}/cm^3$, wherein the atomic percentage is the number of impurity atoms to the total number of impurity atoms, silicon atoms and germanium atoms.

Process conditions for the epitaxy process are then changed to form second SiGe regions 42 on SiGe regions 40. Preferably, germanium in SiGe regions 42 has a greater atomic percentage than in SiGe regions 40. In an exemplary embodiment, germanium atomic percentage in SiGe regions 42 is between about 25 atomic percent and about 35 atomic percent. Preferably, the formation of SiGe regions 42 is performed in a same environment (in-situ formed) as the formation of SiGe regions 40. The increase in germanium atomic percentage may be achieved by increasing the partial pressure (or flow rate) of the Ge-containing gases such as $GeH_4$. In the preferred embodiment, top surfaces 46 of the SiGe regions 42 are preferably higher than the top surfaces 47 of LDD regions 30. In alternative embodiments, at least one of top surfaces 46 and bottom surfaces 44 of SiGe regions 42 are level with the respective top surfaces 47 and bottom surfaces 43 of LDD regions 30.

An advantageous feature of embodiments of the present invention is that with SiGe regions 42 having a high germanium concentration, the stress applied to the channel region is high since SiGe regions 42 are at a same level as the channel region.

In the preferred embodiment, no p-type impurity is doped in SiGe regions 42. In alternative embodiments, a p-type impurity in SiGe regions 42 is in-situ doped to an impurity concentration substantially lower than the atomic percentage of the p-type impurity in SiGe regions 40. In an exemplary embodiment, the p-type impurity in SiGe regions 42 is in-situ doped to an impurity concentration of less than about $5 \times 10^{18}/cm^3$. It is to be noted that even though SiGe regions 42 are not in-situ doped, diffused p-type impurities from neighboring doped SiGe layers and from implantations will still increase the impurity concentration in SiGe regions 42 upon heating, for example, to between about $5 \times 10^{18}/cm^3$ and about $5 \times 10^{19}/cm^3$.

The diffused and implanted impurities will provide the needed conductivity for the non-doped SiGe regions 42. However, to gain short channel benefit, additional process steps may be necessary to space the implanted impurities slightly away from the vertical edge of non-doped SiGe regions 42 next to LDD regions 30. To achieve this, a thin dielectric layer (not shown) can be deposited on the MOS device shown in FIG. 6. The thin dielectric layer is then patterned with its horizontal part etched, leaving thin vertical dielectric layers 49 attached to the spacers 34. Implantation is then performed. Due to the presence of thin dielectric layer 49, a thin vertical area, whose width substantially equals to the thickness of thin dielectric layer 49, of the SiGe regions 42 is free from the implanted impurities.

Figure 9:
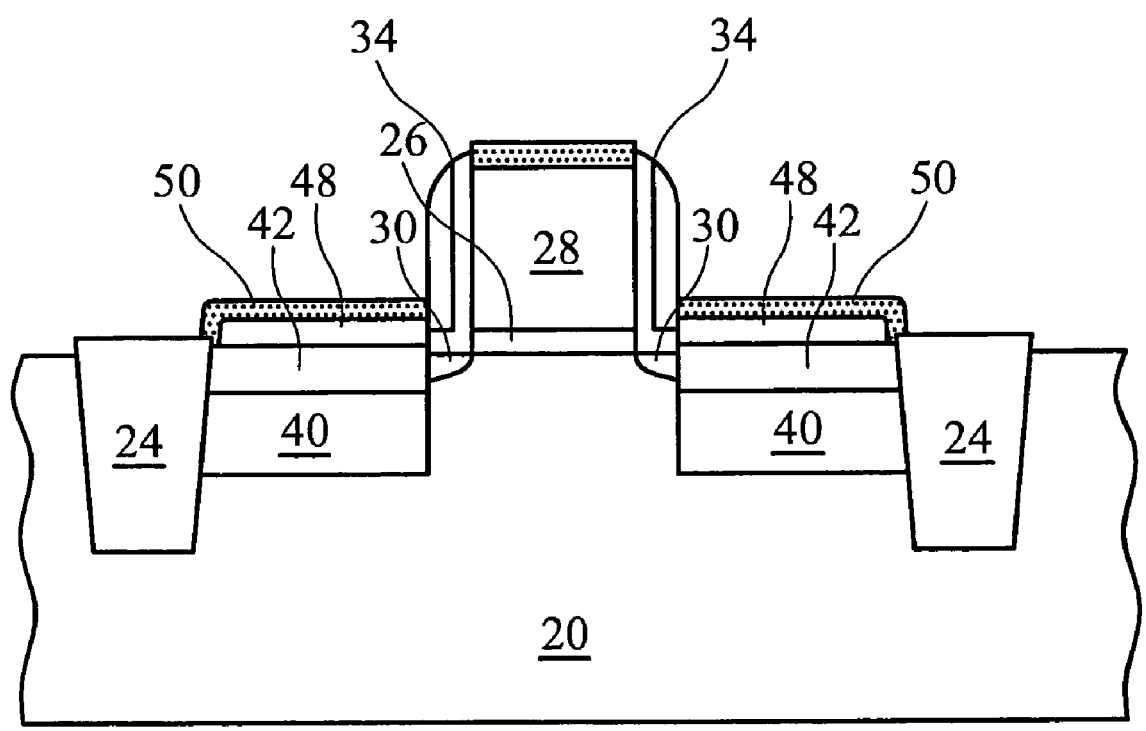
FIG. 9 illustrates the formation of silicide regions.

Another method for achieving the same effect as discussed in preceding paragraph is to remove spacer 34 and form new spacers thicker than spacers 34. Before the removal, the vertical portions of spacers 34 were aligned with the vertical edges of the SiGe regions 42 (FIG. 9). The new spacers thus will overlap portions of SiGe region 42. The portions of SiGe regions 42 directly under the new spacers will be shadowed from implantation.

Third SiGe regions 48 are then formed on second SiGe regions 42. The germanium atomic percentage in SiGe regions 48 is preferably lower than that in SiGe regions 42. An advantageous feature of having lower germanium concentration in SiGe regions 48 is that it is easy to form a silicide on SiGe regions with less germanium. In an exemplary embodiment, germanium in SiGe regions 48 has an atomic percentage of between about 10 atomic percent and about 20 atomic percent. SiGe regions 48 preferably have a thickness of between about 100 Å and about 300 Å.

P-type impurities, such as boron, are preferably in-situ doped in SiGe regions 48. In an exemplary embodiment, p-type impurities in SiGe regions 48 have a concentration of between about $1 \times 10^{20}/cm^3$ and about $1 \times 10^{21}/cm^3$.

Figure 7A:
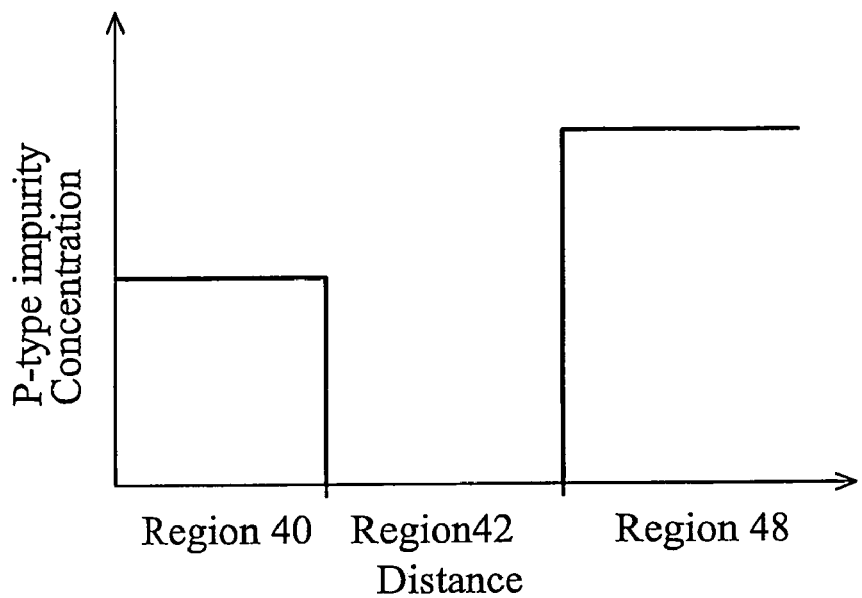
FIGS. 7A through 7C illustrate exemplary impurity concentration profiles in the three regions of SiGe stressors.
Figure 7B:
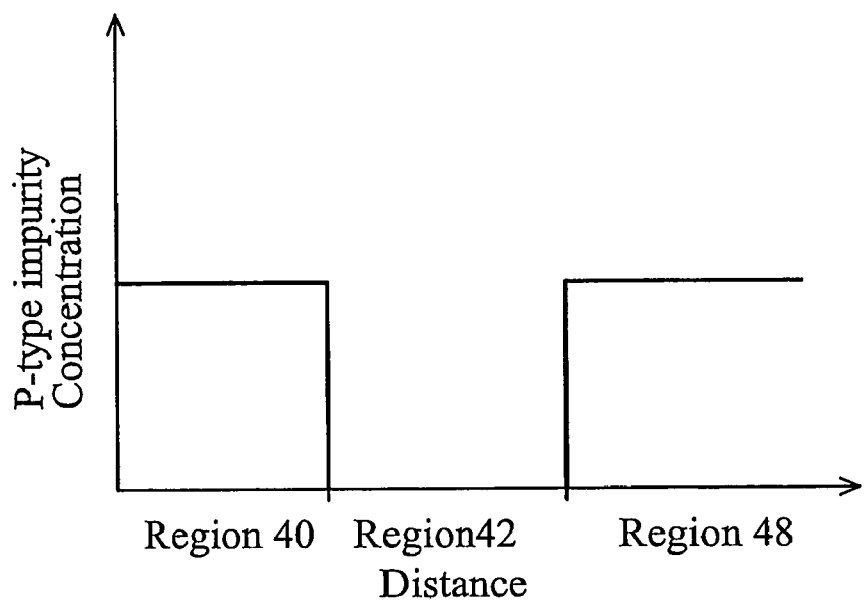
Figure 7C:
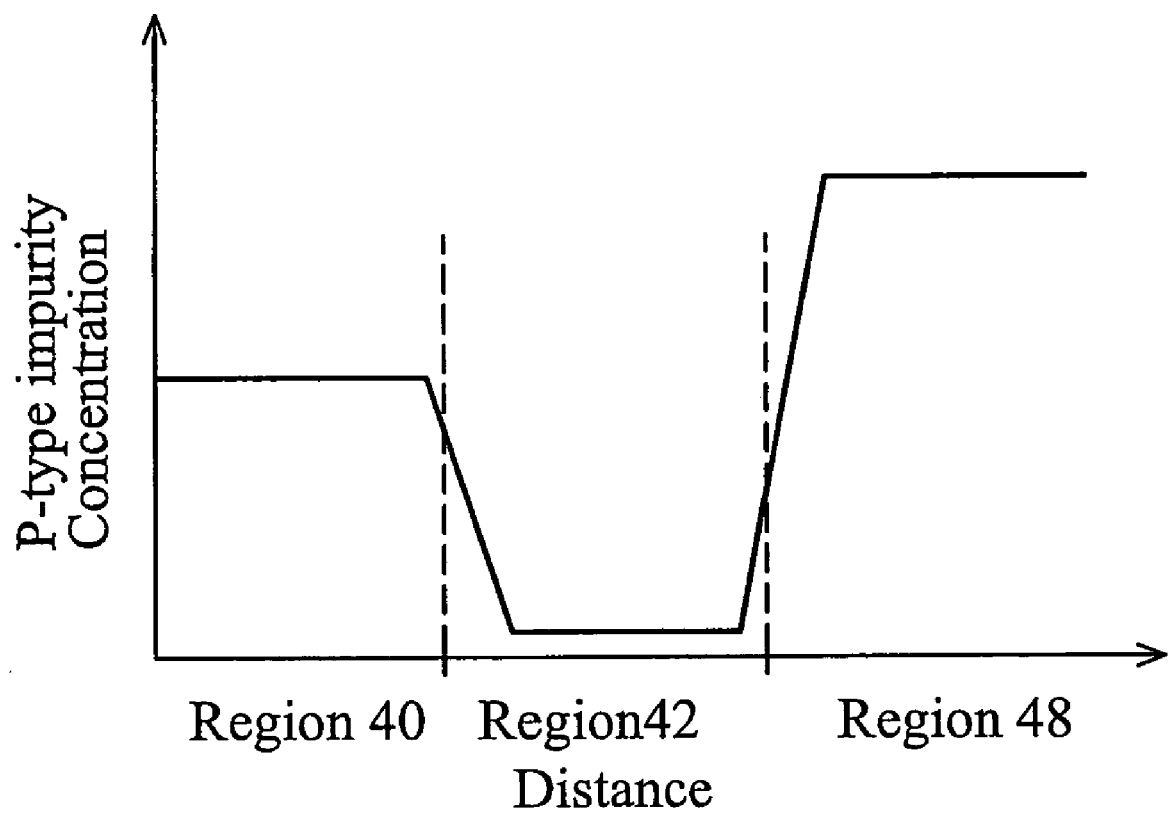

FIGS. 7A, 7B and 7C schematically illustrate several profiles of p-type impurities in-situ doped into SiGe regions 40, 42 and 48. Please note that the subsequent annealing processes will change the profiles. The Y-axis indicates schematic impurity concentration, while the X-axis represents vertical distances between bottom surfaces of SiGe regions 40 and points in SiGe regions 40, 42 and 48. Referring to 7A, the p-type impurity concentration in SiGe regions 42 is substantially close to zero, which means that SiGe regions 42 are either not in-situ doped, or in-situ doped to a low impurity concentration. In SiGe regions 48, the p-type impurity concentration is in-situ doped to a concentration greater than that in SiGe regions 40. Referring to FIG. 7B, SiGe regions 40 are doped to a first impurity concentration. The p-type impurity is then reduced to a substantially low level, such as zero, when SiGe regions 42 are formed. When SiGe regions 48 are formed, the p-type impurity is doped again to a substantially same level as the first impurity concentration. Please note that even through SiGe regions 42 are not doped, the p-type impurity will be diffused from SiGe regions 40 and 48. However, the impurity concentration in SiGe regions 42 will likely be less than about 0.01 atomic percent, which is equivalent to a concentration of about $5 \times 10^{18}$ $cm^{-3}$. One skilled in the art will realized that the diffused impurity concentration of diffused impurities in SiGe regions 42 is related to various factors, such as the thickness of SiGe regions 42, the element of the impurity, and the compositions of SiGe regions 40, 42 and 48.

FIG. 7C illustrates a gradient profile of in-situ doped p-type impurities. The impurity concentration in the interface regions between SiGe regions 42 and SiGe regions 40 and/or 48 may be gradually changed. This can be achieved by gradually changing the dosage of the impurity implantation when forming the interface regions.

Having a low impurity percentage in SiGe regions 42 has two advantageous features. First, SiGe regions 42 act as a sink, or a diffusion barrier, for laterally diffused p-type impurity. With a low p-type impurity concentration in SiGe regions 42, less p-type impurity is diffused to the channel region, and thus the short channel characteristics are improved. Second, the commonly used p-type impurities, such as boron, has the effect of reducing the lattice constant of SiGe regions 42, and thus with less p-type impurities in SiGe regions 42, the adverse effect to the stress applied to the channel region is reduced. This means the high channel stress can be preserved, since boron will adversely reduce the compressive channel stress.

The p-type impurity concentration in SiGe regions 40 is preferably lower than in SiGe regions 48. With lower p-type impurity concentrations at the bottom of SiGe regions 40, which are close to junction regions, the junction leakage current is reduced due to the lower electrical field across the depletion region of the junctions.

Figure 8A:
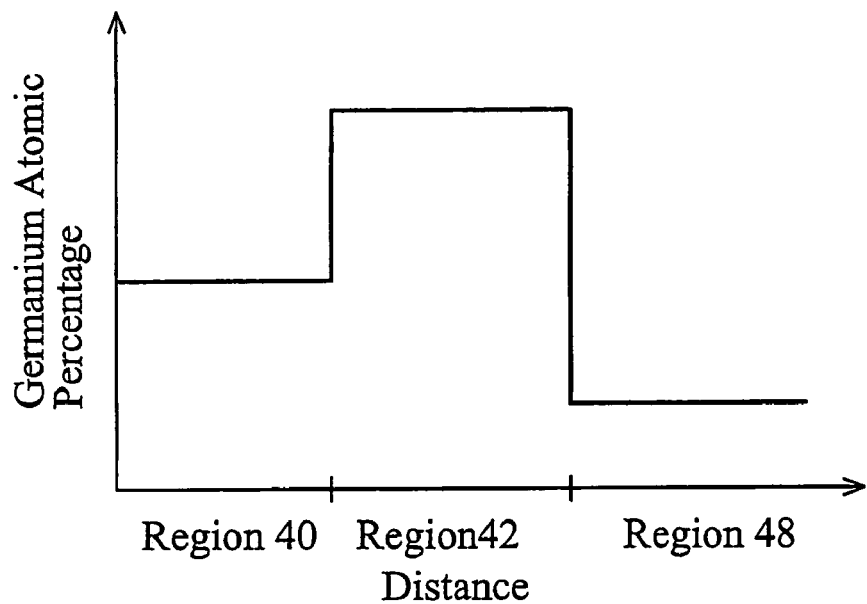
FIG. 8A through 8C illustrate exemplary germanium atomic percentage profiles in the three regions of SiGe stressors.
Figure 8B:
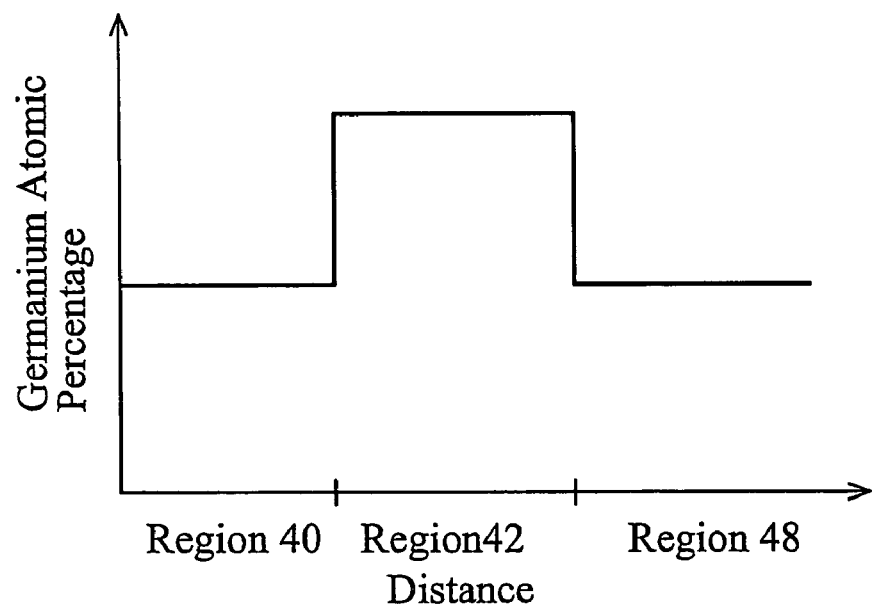
Figure 8C:
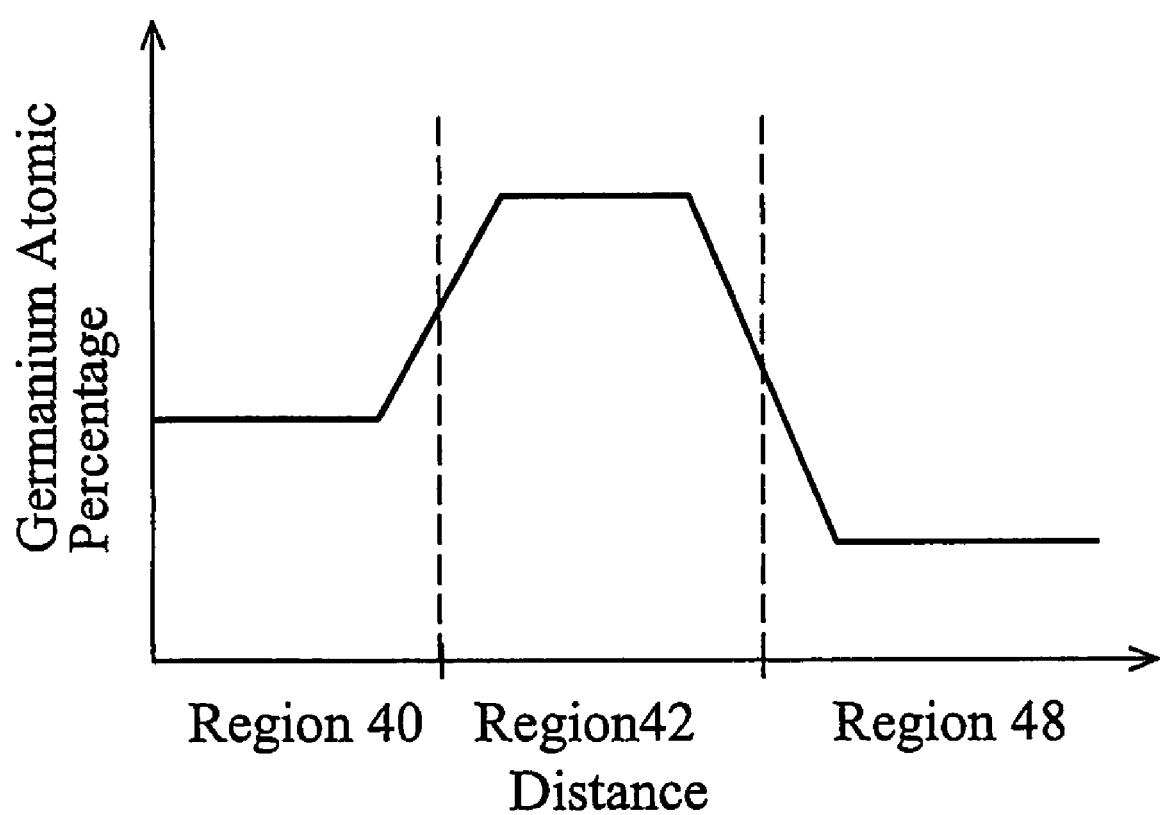

FIGS. 8A, 8B and 8C schematically illustrate distributions of germanium in SiGe regions 40, 42 and 48. The Y-axis indicates germanium atomic percentages, while the X-axis also represents a vertical distance from the bottom surface of SiGe regions 40 to points in stress regions 40, 42 and 48. Referring to FIG. 8A, the germanium in SiGe regions 40 has a first germanium percentage. The germanium percentage is then increased to a higher value in SiGe regions 42. When forming SiGe regions 48, the germanium percentage is reduced to a level lower than in SiGe regions 40. Referring to FIG. 8B, SiGe regions 40 and 48 have substantially the same germanium percentages, while the germanium percentage in SiGe regions 42 is higher. The transition of germanium concentrations in the interface regions may be abrupt (alternatively referred to as having a box structure) as are shown in FIGS. 8A and 8B, or gradual, as is shown in FIG. 8C.

Preferably, SiGe regions 42 have a higher germanium concentration than SiGe regions 40 and 48. In an exemplary embodiment, the germanium atomic percentage in SiGe regions 42 is greater than about 25 atomic percent, while the germanium atomic percentage in SiGe regions 40 and 48 are each less than about 25 atomic percent. Since the channel region of the resulting PMOS device is between SiGe regions 42, a high stress is applied to the channel region. An advantageous feature for SiGe regions 40 to have a relatively low germanium concentration is that the lattice constant of SiGe regions 40 will be closer to the lattice constant in substrate 20, and thus leads to a reduced interface stress.

Optionally, spacers 34 are removed, and new gate spacers (not shown), which may be thicker than spacers 34, are formed. An impurity implantation may be optionally performed. The implantation may dope a surface region of SiGe regions 48 to a high impurity concentration, for example, to about 1E20/cm3 and about 1E21/cm3. However, a lower concentration may be introduced due to the fact that SiGe regions 40, 42 and 48 have already been in-situ doped. SiGe regions 48, 42 and 40 typically receive increasingly lower dosage due to the natural distribution of the implanted atoms. As a result, SiGe regions 42 may have a high impurity concentration than in SiGe regions 40 if the implantation dosage is high. Alternatively, SiGe regions 42 may have a low impurity concentration than in SiGe regions 40 if the implantation dosage is low.

It is realized that in-situ doping impurities and implanting impurities both have advantageous and disadvantageous features. The majority of in-situ doped impurities, for example, more than 80 percent, are activated as deposited, even without an additional anneal, and thus are more helpful for reducing sheet resistance. However, due to high in-situ doping concentration and possibly the super-saturating in the doped region, the in-situ doped impurities easily diffuse to neighboring regions, both vertically and laterally, upon heating. Implanted impurities, on the other hand, have lower activation rates, for example, about 30 percent, even with an anneal. But they are more likely to be diffused vertically due to implantation damages along the vertical direction. One skilled in the art will be able to determine an optimum doping scheme based on design requirements.

FIG. 9 illustrates the formation of germano-silicide regions 50, which may have a thickness of between about 50 Å and about 300 Å. Throughout the description, germano-silicide regions 50 are also referred to as silicide regions 50. As is known in the art, silicide regions 50 are preferably formed by blanket depositing a thin layer of metal, such as nickel, platinum, palladium, vanadium, titanium, cobalt, tantalum, ytterbium, zirconium, and combinations thereof. The substrate is then heated, which causes the silicon and germanium to react with the metal where contacted. After the reaction, a layer of metal silicide and/or metal germano-silicide is formed between silicon/germanium and metal. The un-reacted metal is selectively removed through the use of an etchant that attacks metal but does not attack silicide and germano-silicide. Please note that the silicidation process may fully consume SiGe regions 48, and thus silicide regions 50 are located directly on SiGe regions 48.

In the embodiment discussed in preceding paragraphs, the SiGe stressors include three regions with different compositions. More layers may be formed to further tune the performance of the MOS devices. For example, a thin silicon layer may be formed on SiGe regions 48 to improve silicide formation.

Although the embodiments discussed in the preceding paragraphs uses SiGe stressor formed in PMOS devices as examples, one skilled in the art will realized that the concept of the present invention is readily available for the formation of NMOS devices. The NMOS devices may have a similar structure as illustrated in FIG. 7, except that regions 40, 42 and 48 comprise SiC instead of SiGe, and n-type impurities such as phosphorus and/or arsenic replace p-type impurities. Preferably, the n-type impurities profile in SiC regions 40, 42 and 48 are similar to the respective p-type impurities, as discussed in preceding paragraphs, although carbon atomic percentage is typically lower than atomic percentage. For example, atomic percentages of carbon in SiC stressors are less than about 3 percent.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A metal-oxide-semiconductor (MOS) device comprising:

a semiconductor substrate;

a gate stack on the semiconductor substrate; and a stressor having at least a portion in the semiconductor substrate and adjacent the gate stack, wherein the stressor comprises:

a first stressor region having a first impurity concentration;

a second stressor region having a second impurity concentration on the first stressor region; and a third stressor region having a third impurity concentration on the second stressor region, wherein the second impurity concentration is substantially lower than the first and the third impurity concentrations.

2. The MOS device of claim 1 further comprising a lightly doped source/drain (LDD) region adjacent the gate stack, wherein the second stressor region has a top surface higher than a top surface of the LDD region, and a bottom surface lower than a bottom surface of the LDD region.

3. The MOS device of claim 1 further comprising a lightly doped source/drain (LDD) region adjacent the gate stack, wherein at least one of a top surface and a bottom surface of the second stressor region substantially levels with a respective top surface and a bottom surface of the LDD region.

4. The MOS device of claim 1, wherein the stressor comprises a material selected from the group consisting essentially of SiGe and SiC.

5. The MOS device of claim 1, wherein the first stressor region and the semiconductor substrate have a first lattice constant difference, the second stressor region and the semiconductor substrate have a second lattice constant difference, the third stressor region and the semiconductor substrate have a third lattice constant difference, and wherein the second lattice constant difference is substantially greater than the first and the third lattice constant differences.

6. The MOS device of claim 1, wherein the second impurity concentration is lower than about $5 \times 10^{18}$ /cm$^3$.

7. A metal-oxide-semiconductor (MOS) device comprising:

a semiconductor substrate;

a gate stack on the semiconductor substrate;

a lightly-doped source/drain (LDD) region; and a SiGe stressor having at least a portion in the semiconductor substrate and adjacent the gate stack, wherein the SiGe stressor comprises:

a first SiGe region doped with a p-type impurity having a first impurity concentration;

a second SiGe region doped with a p-type impurity having a second impurity concentration; and a third SiGe region doped with a p-type impurity having a third impurity concentration, wherein the second impurity concentration is substantially lower than the first and the third impurity concentration.

8. The MOS device of claim 7, wherein the second SiGe region having a top surface higher than a top surface of the LDD region, and a bottom surface lower than a bottom surface of the LDD region.

9. The MOS device of claim 7, wherein the second impurity concentration is lower than about 10 percent of each of the first and the third impurity concentrations.

10. The MOS device of claim 7, wherein a germanium atomic percentage in the second SiGe region is greater than germanium atomic percentages in the first and the third SiGe regions.

* * * * *